United States Patent [19]
Takemura et al.

[11] 4,343,083
[45] Aug. 10, 1982

[54] METHOD OF MANUFACTURING FLEXIBLE PRINTED CIRCUIT SHEETS

[75] Inventors: Katsuyoshi Takemura; Masatoshi Kondo, both of Hirakata; Fumio Hasuike, Kadoma; Yoshifumi Okada, Neyagawa, all of Japan

[73] Assignee: Matsushita Electric Industrial Co. Ltd., Kadoma, Japan

[21] Appl. No.: 83,932

[22] Filed: Oct. 11, 1979

[30] Foreign Application Priority Data

Oct. 11, 1978 [JP] Japan .................... 53-125340
Oct. 11, 1978 [JP] Japan .................... 53-125341

[51] Int. Cl.³ .......................................... H05K 3/30
[52] U.S. Cl. ................................. 29/832; 29/847
[58] Field of Search ............. 29/704, 720, 839, 840; 228/6 A, 180 A; 174/52 PE; 357/70

[56] References Cited

U.S. PATENT DOCUMENTS

| | | | |
|---|---|---|---|
| 3,440,027 | 4/1969 | Hugle | 174/52 PE X |
| 3,724,068 | 4/1973 | Galli | 228/6 A X |
| 3,771,711 | 11/1973 | Lesyk et al. | 228/180 A X |
| 3,831,252 | 8/1974 | Miller | 29/704 X |
| 3,908,075 | 9/1975 | Jackson et al. | 357/70 X |
| 3,968,563 | 7/1976 | Hamlin | 228/180 A X |
| 4,050,618 | 9/1977 | Angelucci, Sr. et al. | 228/6 A |
| 4,234,666 | 11/1980 | Gursky | 357/70 X |

*Primary Examiner*—Francis S. Husar
*Assistant Examiner*—Carl J. Arbes
*Attorney, Agent, or Firm*—Wenderoth, Lind & Ponack

[57] ABSTRACT

A method of manufacturing printed circuit sheets which is capable of efficiently manufacturing printed circuit sheets from a base sheet composed of a base material in a sheet form having applied at least on one surface an electrically conductive foil.

3 Claims, 7 Drawing Figures

METHOD OF MANUFACTURING FLEXIBLE PRINTED CIRCUIT SHEETS

BACKGROUND OF THE INVENTION

The present invention relates to an electrical printed circuit board (referred to as a printed circuit sheet hereinbelow) and more particularly, to a method of manufacturing a flexible printed circuit sheet in which processes such as continuous formation of electrically conductive circuit patterns on a base sheet of the flexible printed circuit sheet, and automatic connection or soldering of electronic parts onto the electrically conductive circuit patterns by movement of the base sheet, etc. are effected in an efficient manner and with high accuracy.

With the recent trend toward miniaturization of various electronic appliances, there has been a strong demand to further simplify the structure of a printed circuit board, with a further reduction of its thickness and weight and also facilitation of the manufacturing process thereof as well as an improvement in its reliability in actual applications. Accordingly, various attempts have been made to replace the conventional rigid or stiff printed circuit board by an extremely thin flexible printed circuit sheet, but an efficient method of manufacturing such flexible printed circuit sheets fully meeting the requirements therefore has not yet been presented due to difficulties in processings thereof and the like.

SUMMARY OF THE INVENTION

Accordingly, an essential object of the present invention is to provide a method for manufacturing a printed circuit sheet which is capable of efficiently manufacturing the printed circuit sheet from a base sheet composed, for example, of a base material in a sheet form having applied thereon, at least on its one surface, electrically conductive foil with substantial elimination of disadvantages inherent in the conventional manufacturing methods of this kind.

Another important object of the present invention is to provide a method of manufacturing a printed circuit sheet of the above described type which has simple processes and is capable of manufacturing the flexible printed circuit sheets with a high reliability on a large scale at low cost.

In accomplishing these and other objects, according to one preferred embodiment of the present invention, the method of manufacturing a flexible printed circuit sheet includes the steps of providing rows of guide holes at predetermined intervals along opposite edges in the longitudinal direction of a flexible base sheet of belt-like configuration and prepared by applying electrically conductive foil at least onto one entire surface of the flexible base sheet, forming electrically conductive circuit patterns in areas defined by frames formed by leaving the electrically conductive foil at the peripheral portions thereof and at predetermined intervals in the longitudinal direction between the rows of the guide holes, and causing the flexible base sheet to be moved and positioned by engagement of the guide holes with driving means for selective formation of part or all of the electronic circuit by electrically connecting electronic parts to the electronic circuit patterns at the time of the positioning. After connecting the required electronic parts to the conductive circuit patterns, the flexible base sheet is cut off along the frame, and thus, the necessary flexible printed circuit sheets are readily obtained in an efficient manner, with substantial elimination of disadvantages inherent in the conventional methods of making such printed circuit sheets.

BRIEF DESCRIPTION OF THE DRAWINGS

These and other objects and features of the present invention will become apparent from the following description taken in conjunction with the preferred embodiment thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
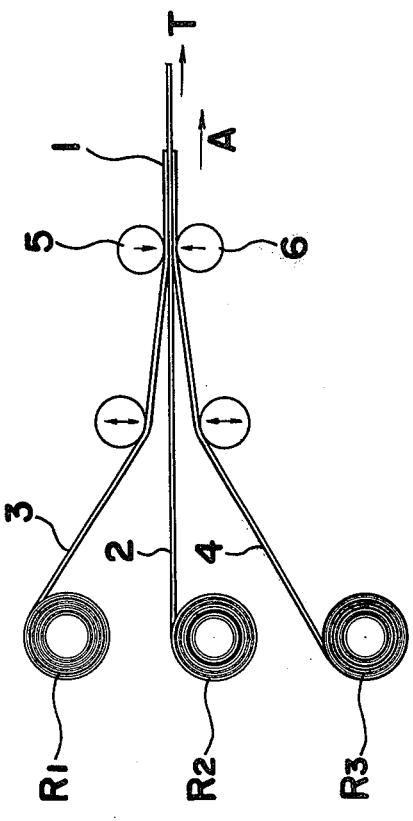
FIG. 1 is a schematic side elevational view explanatory of an arrangement for producing a base sheet for use in making flexible printed circuit sheets.

Referring now to the drawings, as shown in FIG. 1, for producing a base sheet 1 for the flexible printed circuit sheet as described above, a flexible base material 2, for example, of synthetic resin such as polyester, polyimide, etc. in a belt-like form having thickness of about 0.012 to 0.3 mm is drawn out from a roll R2 and has applied, on its opposite surfaces, electrically conductive foils 3 and 4 also drawn out from corresponding rollers R1 and R3, as it passes between a pair of pressing rollers 5 and 6 under proper pressure, temperature and with the application of a suitable adhesive. In the above case, the flexible base material 2 is subjected to tension indicated by the arrow T at all times for preventing sagging, and therefore, in the base sheet 1 as thus produced, the flexible base material 2 is in a state where it is slightly stretched in the longitudinal direction shown by the arrow A.

In the present invention, it is desired to manufacture the flexible printed circuit sheet from the base sheet 1 as described above in an efficient manner and with a high accuracy.

Figure 2:
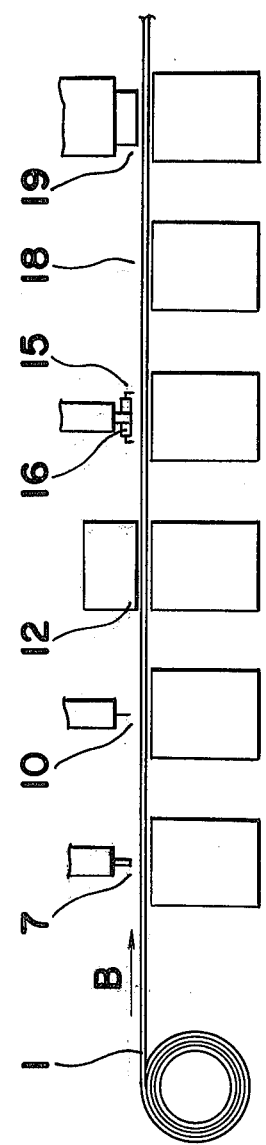
FIG. 2 is a schematic side elevational view explanatory of processes for manufacturing the flexible printed circuit sheets according to one preferred embodiment of the present invention.
Figure 3:
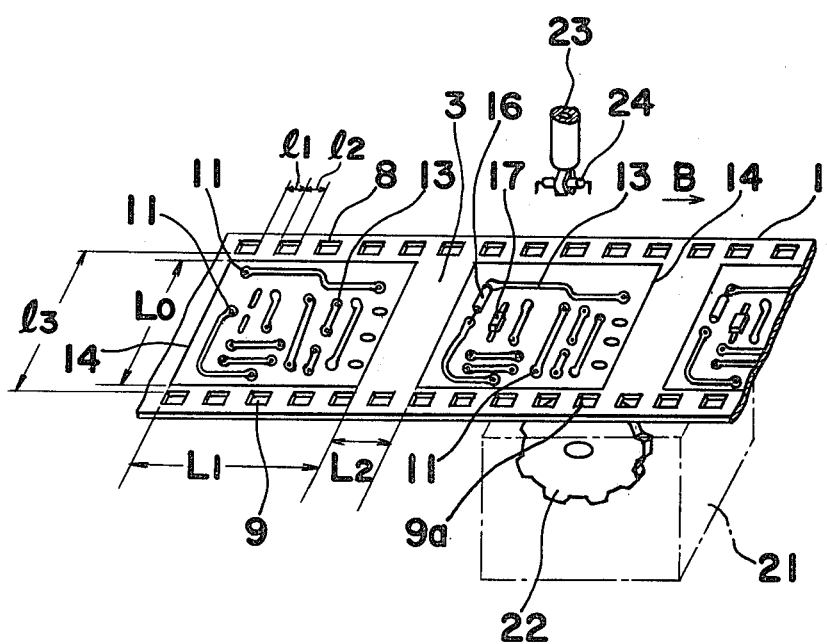
FIG. 3 is a fragmentary perspective view of the printed circuit sheet on an enlarged scale for explaining the attaching of electrical parts according to the method of the present invention.

Referring to FIGS. 2 and 3 sequentially showing processes for manufacturing the flexible printed circuit sheet to which necessary electronic parts are electrically connected, the base sheet 1 having the electrically conductive foils 3 and 4 applied on the entire area of the opposite surfaces thereof as described earlier with reference to FIG. 1 and wound in a roll form is successively drawn out in the direction shown by the arrow B. In a first process step 7, guide holes or perforations 8 and 9 each having a predetermined length $l_2$ are formed in rows at predetermined intervals $l_1$ along opposite edges in the longitudinal direction of the base sheet 1 together with other necessary openings, for example, by a pressing operation, and in a second process step 10, openings 11 for insertion of lead wires of electronic parts are formed, for example, by a drill or the like. Subsequently, in a third process step 12, predetermined electrically conductive circuit patterns 13 for the printed circuit sheet are formed on the base sheet 1 by etching. In the above case, the width of the printed circuit board on which the electrically conductive foils 3 and 4 are formed is L0 in width which is smaller than a distance $l_3$ between the rows of the guide holes 8 and 9, and the length is L1 and is in a predetermined relation with respect to the guide holes 8 and 9, and by successive etching at equal intervals, the electrically conductive circuit patterns 13 are formed thereon.

Figure 4:
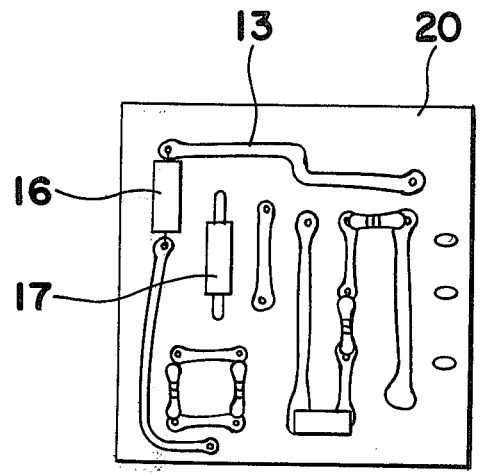
FIG. 4 is a fragmentary top plan view of the printed circuit sheet on a still larger scale, obtained in the method of FIG. 3.

More specifically, the base sheet 1 is subjected to the etching within a predetermined area 14a having a width L0 and length L1 to form therein the electrically conductive circuit patterns 13, and thus the entire peripheral edge 14 of the area 14 is surrounded by the electrically conductive foils 3 and 4 which form a frame 14b therefore. In the foregoing embodiment, the length L1 of each area 14a is made equal to the length constituted by $(5l_2+4l_1)$, while the interval L2 between the respective areas 14a is made equal to the length constituted by $(l_2+2l_1)$, whereby the guide holes 8 and 9 and the electrically conductive circuit patterns 13 are sequentially formed in a predetermined relation to each other both positionally and in terms of distance. In a fourth process 15 step, to the electrically conductive circuit patterns 13 thus formed, for example, an electronic part 16 with lead wires is attached by inserting the lead wires thereof into the corresponding openings 11, while a leadless electronic part 17 is temporarily fixed by adhesives or the like. After soldering in a fifth process step 18, the base sheet 1 is cut along the peripheral edge 14 in a sixth process step 19 to provide the flexible printed circuit sheet 20 to which the electronic parts 16 and 17 are connected as shown in FIG. 4.

It is to be noted here that in the above procedures, positioning of the base sheet 1 in each of the process steps described above is effected by using the guide holes 8 and 9.

More specifically, in FIG. 3, the temporary attaching of the electronic parts 16 and 17 in the fourth process step 15 is effected by an electronic part automatic temporary holding unit 21. In other words, the base sheet 1 on which the electrically conductive circuit patterns 13 are sequentially formed is intermittently fed in the direction of the arrow B by rotation of a sprocket wheel 22 of the holding unit 21 which engages the guide holes 8 and 9 of said base sheet 1, and is stopped at a predetermined rotational position of the sprocket wheel 22, at which position, an arm 23 provided on the holding unit 21 is arranged to pick up a predetermined electronic part 24 accommodated in a part storage means (not shown) according to a preset program and then to descend onto the electrically conductive circuit patterns 13 so as to insert the lead wires of the electronic part into the corresponding openings 11 or to stick terminal portions of a leadless electronic part to predetermined positions on the circuit patterns 13 with adhesives.

In the above case, needless to say the attaching process for the electronic part with lead wires may be carried out independently of the attaching process for the leadless electronic part depending on the requirements.

The relative positional relation between the lead wire inserting position or position at which the electronic parts are applied by adhesive and the electrically conductive circuit patterns 13 is determined by distances in X and Y directions from the edge of a particular guide hole 9a of the guide holes 9. In other words, the electronic part automatic temporary holding unit 21 is preliminarily set so that the positions of the lead wires of the electronic part are aligned with the corresponding openings 11 according to the distances in the X and Y directions based on the edge of the particular guide hole 9a. In the case of the leadless electronic part 17, such part 17 is also arranged to be fixed at a position determined on the basis of the similar reference position as described above.

Figure 5:
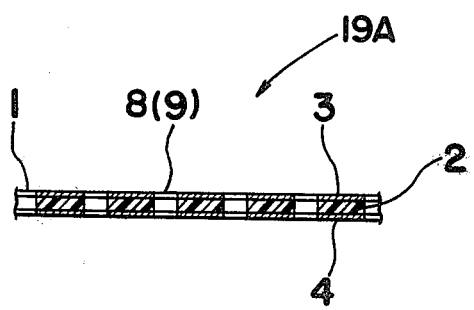
FIG. 5 is a fragmentary side sectional view of the base sheet for the printed circuit sheet of FIG. 2 particularly showing the arrangement of guide holes therein.

It is to be noted here that in the above arrangement, the positions of the lead wire insertion openings 11 and electronic part adhering positions can be set on the base sheet 1 with high accuracy. More specifically, since the electrically conductive foils 3 and 4 are provided around the periphery 14, and are also still present around the guide holes 8 and 9, the edge of each of the guide holes 8 and 9 is accurately defined by the electrically conductive foils 3 or 4 at one side thereof as shown in FIG. 5 for positive engagement with the teeth of the sprocket wheel 22 so as to achieve a stable movement of the base sheet 1 and the correct reference position at the edge of the particular opening 9a, while since the conductive foils 3 and 4 between the areas 14a accurately maintain the distance between said areas 14a, the electronic parts can be mounted with an extremely high positional accuracy on the whole.

On the contrary to the above, if during the formation of the electrically conductive circuit patterns 13, the conductive foils 3 and 4 around the guide holes 8 and 9 are removed by the etching, there may be caused such inconveniences, due to inherent nature of the flexible base material 2 composed of the extremely thin sheet, that the edges of the guide holes 8 and 9 will be deformed and make unstable contact with the teeth of the sprocket wheel, thus obstructing the smooth movement of the base sheet 1, or that, when the guide holes are used for the positioning, the correct reference position will not be available due to elongation or contraction of the flexible base material 2, thus making it very difficult for the base sheet 1 to be sequentially passed through each of the processes in an efficient manner. The deformation due to the elongation and contraction of the flexible base material 2 as described above also takes place when the conductive foils 3 and 4 between the areas 14a are removed. The arrangement of the present invention in which the guide holes 8 and 9 are formed at positions in the electrically conductive foils 3 and 4 provided around the area 14a for accurately guiding the movement and positioning of the flexible base sheet 1 by the use of said guide holes 8 and 9 is effective not only for the mounting of the electronic parts as described earlier, but also for any other processes requiring correct positionings.

Figure 6:
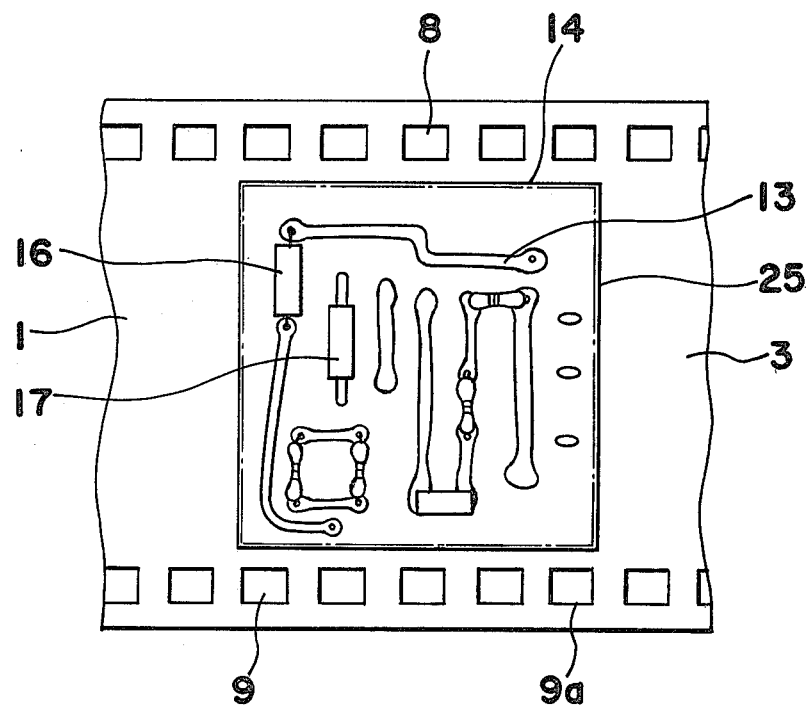
FIG. 6 is a view similar to FIG. 4, which particularly shows the relation of a frame and a cut-off line employed in the method according to the present invention.
Figure 7:
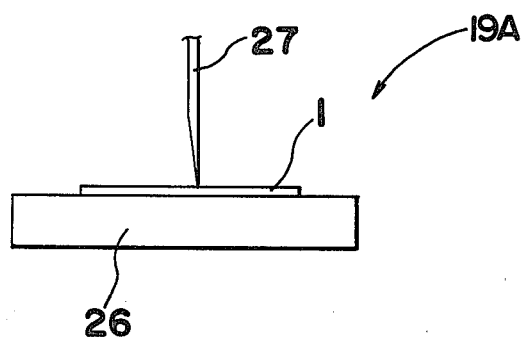
FIG. 7 is a schematic side elevational view for explaining a cutting-off process according to the method of the present invention.

Referring to FIGS. 6 and 7, another process step 19A for cutting off the base sheet 1 after the electronic parts 16 and 17, etc. have been soldered thereto for obtaining the flexible printed circuit sheet 20 will be described hereinbelow.

The cutting in the cutting-off process step 19A is effected along a predetermined cut-off line 25 provided inside the frame 14 as shown by the periphery line in FIG. 6. For the above cutting, at least the portion of the base sheet on which the cut-off line 25 is located is placed on a flat and rigid base 26 as shown in FIG. 7, and a blade 27 of a cutter is moved vertically downward onto the cut-off line 25 for cutting. The cut-off line 25 is set inside the periphery 14 where the electrically conductive foils 3 and 4 have been preliminarily removed, and therefore, the blade 27 cuts only the flexible base material 2, without the necessity of cutting the conductive foils 3 and 4. Therefore, the cutter blade 27 used only for cutting the soft flexible base material 2 is subjected to less abrasion at the blade edge, which increases the life thereof and enables it to achieve a positive cutting action.

In the above cutting-off process step 19A the flexible base sheet 1 is also guided and positioned by the guide holes 8 and 9 for positively being cut at the cut-off line 25 by the cutter blade 27.

It should be noted here that in the foregoing embodiment, although the present invention is mainly described with reference to the base sheet having the electrically conductive foils on the opposite surfaces thereof, the concept of the present invention is not limited in its application to such base sheet alone, but may readily be applicable to a base sheet having an electrically conductive foil on only one surface or to a base sheet having conductive foils on both surfaces, but having the conductive circuit patterns formed only on one of the surfaces, with the conductive foil on the other surface being entirely removed or partly removed.

It should also be noted that the process steps 7 to 19 described as effected continuously in the foregoing embodiment may be modified to be carried out separately in several groups, and that the present invention is applicable to a case where electrically conductive foils in which conductive circuit patterns are not formed are provided within the periphery 14, and in this case, the cutting-off is effected at the portion of the flexible base material exposed between the periphery 14 and such conductive foil without the conductive circuit patterns.

As is clear from the foregoing description, the method of manufacturing the flexible printed circuit sheet of the present invention includes the steps of providing rows of guide holes at predetermined intervals along opposite edges in the longitudinal direction of a flexible base sheet of belt-like configuration which has been prepared by applying electrically conductive foil at least onto one entire surface of a flexible base material, forming electrically conductive circuit patterns within areas defined by frames formed by leaving said electrically conductive foil around the peripheral portions of the areas and provided at predetermined intervals in the longitudinal direction and extending between the rows of said guide holes, and causing said flexible base sheet to be moved and positioned through engagement of said guide holes with driving means for selective formation of part or all of an electronic circuit by connecting electronic parts to said electronic circuit patterns at the time of the positioning. After the necessary electronic parts are connected to the conductive circuit patterns, the flexible base sheet is cut off along the periphery of the area for providing the required flexible printed circuit sheet.

According to the method of the present invention as described above, since the flexible base sheet is moved and positioned while the electrically conductive foil is still present at the peripheral portion of the area in which the conductive circuit patterns are formed, the flexible base sheet is prevented from undesirable elongation or contraction by the presence of such conductive foil, and particularly the edges of the guide holes are protected against deformation by the presence of the conductive foil. Accordingly, despite of the flexible construction, the printed circuit sheet can continuously have electronic parts connected thereto by soldering, etc., by the employment of automatic machines. Furthermore, the belt-like configuration of the flexible base sheet makes it possible to effect continuous attaching of the electronic parts to the conductive circuit patterns in an extremely efficient manner, and by a simple cutting-off operation, completed printed circuit sheets with electronic circuits thereon are readily produced. Therefore, the inefficient work of connecting electronic parts to individual flexible sheets is completely dispensed with, with consequent improvements in efficiency in the manufacture of printed circuit sheets.

Although the present invention has been fully described by way of example with reference to the attached drawings, it is to be noted that various changes and modifications will be apparent to those skilled in the art. Therefore, unless otherwise such changes and modifications depart from scope of the present invention, they should be construed as being included therein.

What is claimed is:

1. A method of manufacturing a flexible printed circuit sheet for use in electrical and electronic equipment, which comprises the steps of:

providing a flexible base sheet having a belt-like configuration and a flexible base material with a layer of electrically conductive material covering the entire surface of at least one side of said flexible base material and having rows of guide holes at predetermined intervals along the opposite longitudinal edges of said base sheet;

forming electrically conductive circuit patterns on said base sheet at predetermined intervals in the longitudinal direction and at positions between the rows of said guide holes, the forming steps for each circuit pattern comprising selectively removing electrically conductive material within an area on said base sheet to leave a circuit pattern within said area, said area having a periphery within which said area lies, said forming step further comprising leaving electrically conductive material around said area with a conductive material edge thereof lying along the periphery of said area, the electrically conductive material which is left on said base sheet after the forming steps for a succession of circuit patterns lying outwardly of the peripheries of said areas and extending between said areas and to the base sheet edges and around said guide holes and said circuit patterns being spaced inwardly from said conductive material edges;

moving said flexible base sheet and positioning the circuit patterns successively at a parts attaching position by engagement of moving and positioning means in said guide holes and connecting electronic parts to the individual circuit patterns successively positioned at said parts attaching position; and thereafter moving said base sheet for positioning the successive circuit patterns in a cutting position and cutting individual flexible printed circuit sheets from said base sheet by cutting said flexible base sheet along and adajacent the conductive material edge defining the periphery of each area and between said conductive material edge and the circuit pattern within that area.

2. A method as claimed in claim 1, wherein said cutting of said flexible base sheet is at position spaced inwardly from said electrically conductive material edge.

3. A method as claimed in claim 1, wherein said cutting of said flexible base sheet is effected by placing said flexible base sheet on a flat base and driving a cutter blade into said flexible base sheet in a direction perpendicular to said flat base.

* * * * *